United States Patent [19]
Dorschky et al.

[11] Patent Number: 5,880,657
[45] Date of Patent: Mar. 9, 1999

[54] PRINTED WIRING BOARD MODIFIED GULL WING SIGNAL LEAD CONNECTION

[75] Inventors: Claus Dorschky, Eckental, Germany; Sean Ortiz, Orlando, Fla.; Kwangsoo Park, Tinton Falls, N.J.; Roland Seitz, Berg, Germany; David L. Wilson, Little Silver, N.J.

[73] Assignee: Lucent Technologies, Inc., Murray Hill, N.J.

[21] Appl. No.: 865,301

[22] Filed: May 29, 1997

[51] Int. Cl.⁶ ................................ H01P 3/08
[52] U.S. Cl. ................ 333/246; 333/33; 333/247
[58] Field of Search ................. 333/12, 33, 260, 333/246, 247, 204

[56] References Cited

U.S. PATENT DOCUMENTS

| | | | |
|---|---|---|---|
| 4,806,892 | 2/1989 | Thorpe et al. | 333/246 |
| 4,870,375 | 9/1989 | Krueger, Jr. et al. | 333/246 X |
| 5,093,640 | 3/1992 | Bischof | 333/33 |
| 5,270,673 | 12/1993 | Fries et al. | 333/246 |
| 5,583,468 | 12/1996 | Kielmeyer et al. | 333/260 X |

*Primary Examiner*—Seungsook Ham
*Attorney, Agent, or Firm*—Frederick B. Luludis; Gregory J. Murgia

[57] ABSTRACT

The propagation of very high frequency signals, e.g., 8 to 10 GHz, via a path printed on a printed wiring board is enhanced by arranging the path so that it simulates a high-quality transmission path at very high frequencies. The path comprises a conventional lead and a series of microstrips, in which the design of the microstrips is optimized to (a) minimize insertion loss and group delay distortion, (b) maximize return loss, and (c) minimize pulse distortion.

17 Claims, 3 Drawing Sheets

5,880,657

PRINTED WIRING BOARD MODIFIED GULL WING SIGNAL LEAD CONNECTION

FIELD OF THE INVENTION

The present invention relates to interfacing very high-frequency signals outputted by a packaged substrate mounted on a printed wiring board with a path extending to another circuit on the printed wiring board, in which the interface includes a so-called gull-wing lead that effectively acts as an inductor at very high frequencies.

BACKGROUND

A packaged substrate may be mounted on a printed wiring board for the purpose of interfacing a source of very high-frequency signals, e.g., an optical fiber, with other circuits also mounted on the printed wiring board. The interface may include a converter that converts the optical signal to an electrical signal and an amplifier that amplifies the resulting signal. A coaxial cable is typically used to connect the output of the amplifier to the other printed wiring board circuits. The prior art has recognized that such a coaxial connection is usually expensive and bulky.

One prior art arrangement uses a set of three so-called gull-wing lead connections in place of a coaxial cable connection. Specifically, the three gull-wing leads extend as terminals from the mounted substrate to three pads printed on the printed wiring board, in which a center gull-wing lead is the signal lead. The pads provide capacitive matching to compensate for the inductance exhibited by the center gull-wing lead at very high frequencies, e.g., up to four GHz. Accordingly, the capacitive compensation, to some extent, neutralizes the degrading effect of the inductance that the center gull-wing lead exhibits in the presence of very high frequency signals.

We have recognized, however, that such prior art compensation suffers from a number of transmission problems. Specifically, it does not deal with, for example, so-called group delay.

SUMMARY OF THE INVENTION

We have specifically recognized that the compensation suggested by the prior art does not adequately deal with so-called group delay, insertion loss and return loss. We further recognized that this inadequacy stems from the fact that the prior art compensates for the gull-wing inductance by means of only a single capacitive matching pad at each end of the gull-wing lead carrying the high frequency signals.

We deal with the problem differently. In particular, we incorporate the gull-wing lead as a central element in a multi-element filter whose transfer function is optimized for the various transmission parameters that come into play at very high frequencies, for example, group delay, insertion loss and return loss. Specifically, we place matching filter sections at respective ends of the gull wing lead such that the compensation and gull-wing lead emulates a predetermined transmission facility that does not degrade very high frequency signals, for example, a coaxial cable.

Thus, in accordance with the principles of the invention the gull-wing lead is incorporated in a transmission line also comprising first and second series of microstrips printed on the associated printed circuit board such that the first and second series of microstrips simulate respective filter segments disposed at respective ends of the gull wing lead which compensate for the inductance exhibited by the gull-wing lead at very high frequencies.

These and other aspects of the claimed invention will be become apparent from the ensuing detailed description and accompanying drawings.

DETAILED DESCRIPTION

Figure 1:
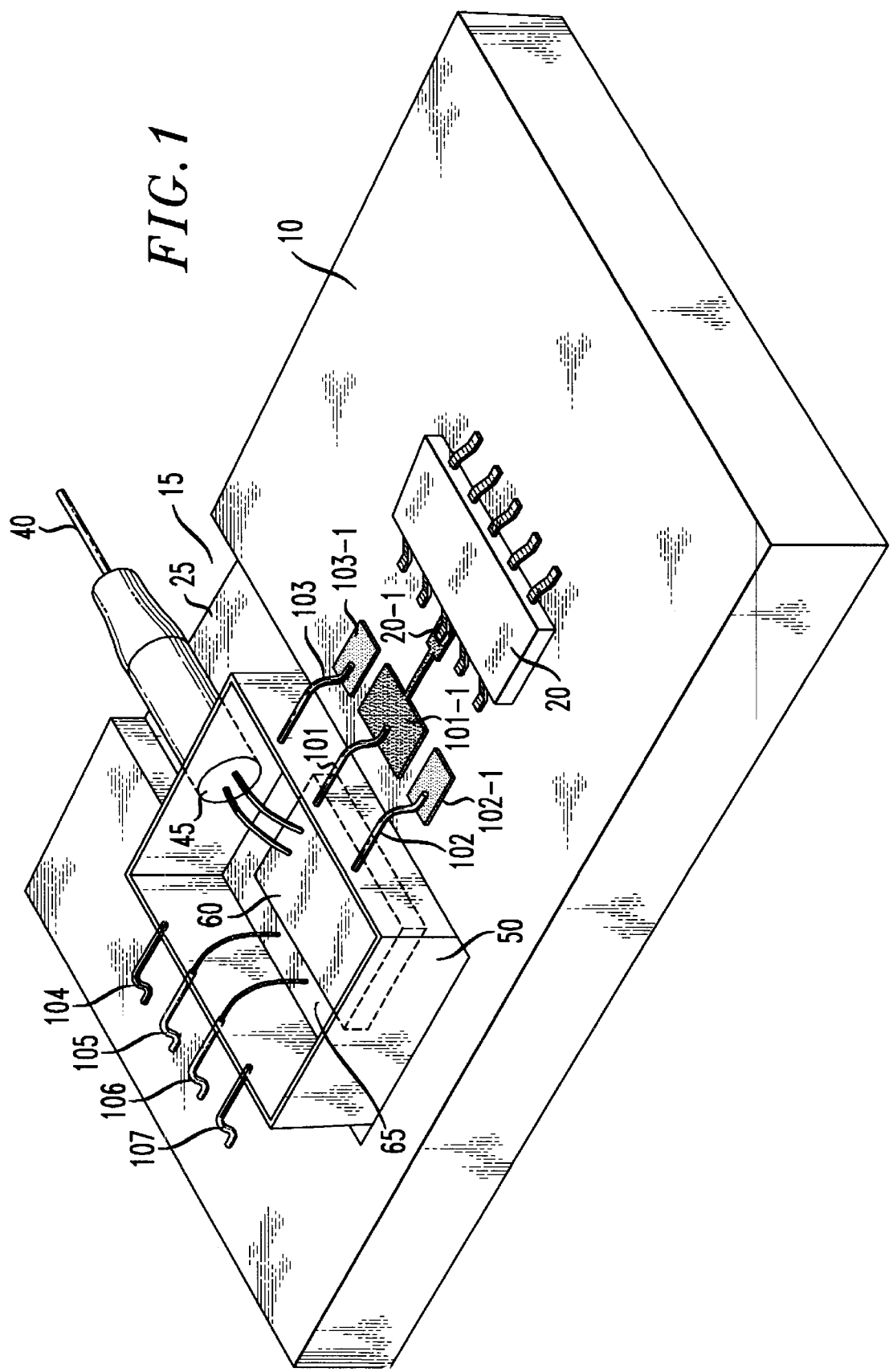
FIG. 1 illustrates a section of a printed wiring board bearing a packaged circuit having gull-wing leads in which at least one of the leads is connected, in accordance with the principles of the invention, to a corresponding pad printed on the wiring board.
Figure 2:
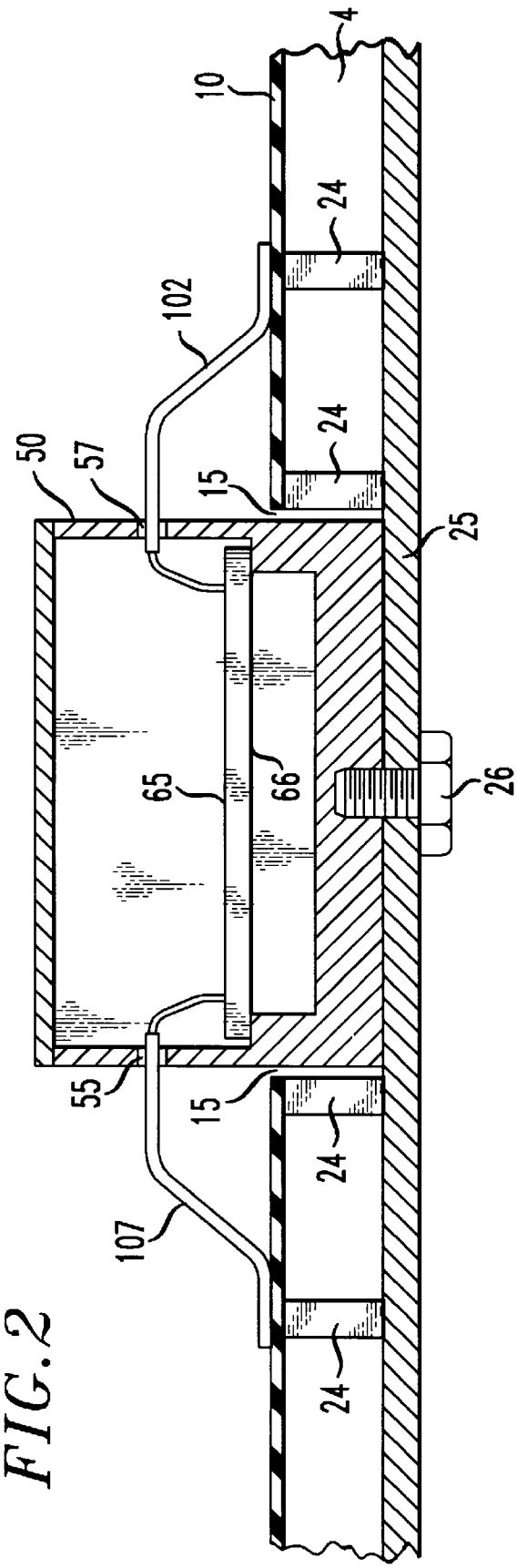
FIG. 2 is a side view showing the way in which the packaged circuit is mounted to the printed wiring board of FIG. 1.

With reference to FIG. 1, surface mounted package 50 includes a ceramic substrate 65 containing amplifier 60, which may be, for example, a so-called trans-impedance amplifier, that amplifies optical signals received via optical fiber 40. (It is noted that the top of package 50 is not shown for purposes of clarity and understanding.) The surface mounting of package 50 to printed wiring board 10 (also referred to herein as printed circuit board 10) is effected by soldering in a conventional manner gull wing leads 101 through 107 to printed wiring board 10 (hereinafter, printed wiring board 10 will also be referred to a PWB 10). It is seen from FIG. 1 that a slot 15 is formed in PWB 10 and package 50 appears to be mounted in that slot in addition to being surface mounted to PWB 10 in the described manner. In an illustrative embodiment of the invention, package 50 is a metal housing. In a typical system, the metal housing of package 50 is connected to system ground. This may be seen more accurately with reference to FIG. 2 which shows a side view of the metal housing of package 50 inserted in slot 15 and in contact with metal backplate 25, in which such contact is obtained by, for example, bolting package 50 to metal backplate 25 using a conventional fastener, e.g., a bolt 26 that is threaded into a threaded hole formed in package 50 via a hole in backplate 25. Metal backplate 25, which is connected to system ground and which is also connected to the ground planes on PWB 10 has a number of ribs 24 formed therein to support PWB 10. It is seen from FIG. 2 that the gull-wing leads pass through metal housing 50 via respective insulated holes 55, and are then connected via appropriate leads to substrate 60. The insulated holes 55 prevent the gull wing leads from coming into contact with system ground as they pass through metal housing 50.

Returning to FIG. 1, a support piece containing a photo-diode 45 is connected to the end of optical fiber 40 that is terminated at package 50. Photodiode 45 thus converts optical signals carried by the fiber to electrical signals and supplies the latter signals to amplifier 60. Amplifier 60 amplifies the converted signals and outputs the amplified result to gull-wing lead 101 via a very thin printed wiring path 207 and a larger printed wiring pad 206 (shown in FIG. 3) which is connected to lead 101. The other end of gull-wing lead 101 is connected to printed wiring pad 101-1. A path 101-2 similar to wiring path 207 then extends pad 101-1 to a terminal 20-1 of a packaged amplifier 20 that is mounted on PWB 10. (It is noted that for the sake of convenience and clarity, other circuits that would be also be mounted on PWB 10 are not shown in the FIGS.) It is assumed herein that gull-wing leads 102 and 103 are not connected to other circuits, and but are connected to system ground via pads 102-1 and 103-1, respectively.

Figure 3:
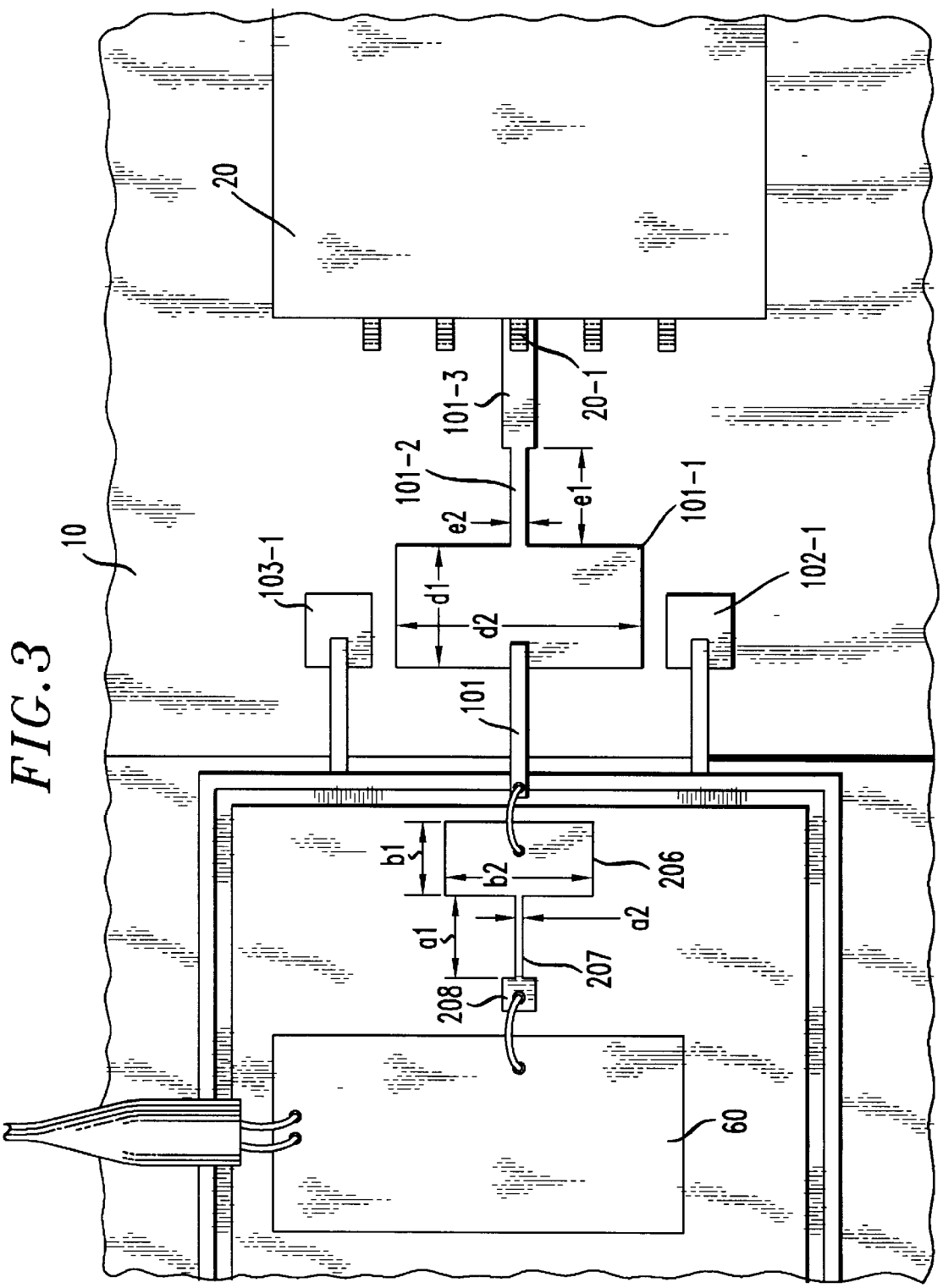
FIG. 3 is a top view of the section of printed wiring board shown in FIG. 1.

A top view of the connection path from substrate 60 to terminal 20-1 is shown in FIG. 3, in which the connection path, in accordance with an aspect of the invention, is designed to compensate for the inductive effect that gull wing-lead 101 exhibits at very high frequencies, e.g., frequencies of 8 GHz to 10 GHz (or data rates of 8 Gbs to 10 Gbs), in which the effect of the inductance severely degrades the level of a high frequency signal that is transported via that lead. Specifically, the path from amplifier 50 to terminal 20-1 is terminated at both ends in a transmission line having an impedance of 50 ohms and connected to ground via a 50 ohm resistance. One such transmission line is simulated by path section 208 whose dimensions are designed in a well-known manner. The other transmission line is simulated by path section 101-3. The dimensions $a_1$ and $a_2$ of path section ("microstrip line") 207 are designed to simulate an inductor at frequencies of, for example, 5 GHz to 10 GHz. In an illustrative embodiment of the invention, dimensions $a_1$ and $a_2$ are 93 mils and 12 mils, respectively. Such dimensions simulate an inductor of approximately 0.71 nano Henrys at the aforementioned frequencies. Similarly, the dimensions $b_1$ and $b_2$ of path section (microstrip line) 206 are designed to simulate a capacitor at frequencies of 8 GHz to 10 GHz. In an illustrative embodiment of the invention, dimensions $b_1$ and $b_2$ are 135 mils and 10 mils, respectively, which effectively simulates a capacitor of, for example, approximately 0.28 pico Farads at the pertinent range of frequencies. Section 206, more particularly, forms one plate of the capacitor and the bottom side 66 of substrate 65 (FIG. 2) forms the other plate, in which side 66 is connected to ground via housing 50. Microstrip lines 101-1 and 101-2 are designed to respectively simulate a capacitor of, for example, approximately 2.8 pico Farads and an inductor of, for example, approximately 0.71 nano Henrys at the aforementioned range of frequencies. These values are achieved in accordance with an illustrative embodiment of the invention by making dimensions $d_1$ and $d_2$ 25 mils and 100 mils, respectively, and making dimensions $e_1$ and $e_2$ 100 mils and 5 mils, respectively. The dimensions of sections 206 and 207 differ from the dimensions of sections 101-1 and 101-2 due to the difference in the dielectric constant at there sections.

Figure 4:
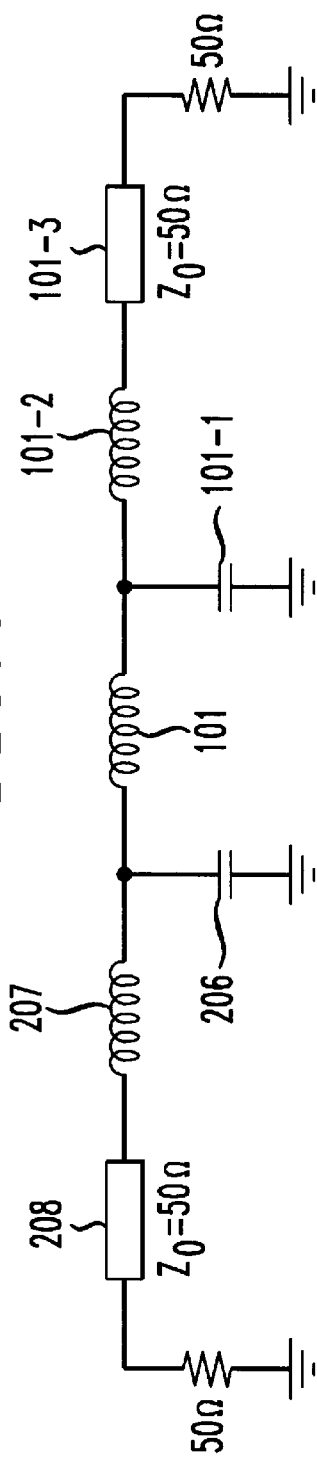
FIG. 4 illustrates an equivalent circuit of the inventive compensation arrangement.

The effective compensation implemented by the above sections is shown in FIG. 4. It can be appreciated from FIG. 4 that the lumped elements of the path effectively simulates a transmission line, e.g., a coaxial cable, which provides superior transmission of high frequency signals from substrate 60 to amplifier 20, in which the path is matched at both ends to prevent reflection of the signal.

(It is noted that the term frequency as used herein should also be taken to mean data rate, and vice-versa. That is, the term frequency is synonymous with the term data rate, and vice versa.)

In accordance with an aspect of the invention, the compensation implemented by the various sections forming the path from substrate 60 and terminal 20-1 is also designed/ optimized to compensate for minimum reflection and insertion loss, as mentioned above, as well as so-called group delay. Briefly, two elements, e.g., a filter, transmission line, capacitor, inductor, etc., having identical magnitude functions but different phases may affect a signal differently. The group delay of an element is defined as the derivative of the phase (in radians) with respect to frequency ω in radians/sec. The group delay of an element represents, physically, the amount of time it takes a signal to pass through the element. If the group delay varies with frequency (i.e., is nonconstant), then different frequency components of a signal such as a digital pulse will be delayed by different amounts of time. This effect is called group delay distortion or dispersion, and it may distort a pulse, causing intersymbol interference, so-called "eye closure", and thus a general degradation of system performance. Such dispersion operates similar to chromatic dispersion that occurs within an optical fiber.

Accordingly, our design is achieved using conventional electrical engineering principles to determine the values of the passive elements forming the above-described compensation. We referred to the teaching disclosed in the well-known text "Computer-Aided Design of Microwave Circuits" by K. C. Gupta et al, published in 1981 by Artech House, Inc., which is hereby incorporated by reference, to determine the dimensions of the above-mentioned microstrip lines needed to emulate the elements forming the inventive compensation. We also used the well-known "Libra/Touchstone" software available from Hewlett-Packard, HP Eesof Division, (which software and teaching is hereby incorporated by reference) to optimize the dimensions of such microstrip lines.

The foregoing is merely illustrative of the principles of the invention. Those skilled in the art will be able to devise numerous arrangements, which, although not explicitly shown or described herein, nevertheless is embody those principles that are within the spirit and scope of the invention.

We claim:

1. Apparatus mounted on a printed circuit board comprising a first circuit operative for receiving a stream of very high frequency digital signals from a source of signals, for then processing the received signals as they are received and supplying the processed result to a second circuit via an output terminal and path extending to said second circuit, said path including a lead connection that simulates an inductor at very high frequencies;

a first series of microstrips printed on said printed circuit board and forming a first segment of said path extending from said terminal to one end of said lead connection such that the first series of microstrips simulates a first filter section at said high frequencies; and a second series of microstrips printed on said printed circuit board and forming a second segment of said path extending from an opposite end of said lead connection to said second circuit such that the second series of microstrips simulates a second filter section at said high frequencies, in which said first and second filter sections compensate for the inductance exhibited by said lead connection at said high frequencies and in which a dielectric constant at said first and second filter sections is different from each other, wherein said first and second filter sections and said lead connection have a transfer function optimized for minimal distortion of a digital pulse.

2. The apparatus of claim 1 wherein the lead connection has a gull wing shape, and wherein the inductance of said gull wing connection is included in forming the first and second filter sections.

3. The apparatus of claim 1 wherein said first and second filter sections and said lead connection simulate a coaxial cable at said high frequencies.

4. The apparatus of claim 1 wherein the transfer function is further optimized for a predetermined signal transmission characteristic.

5. The apparatus of claim 4 wherein the predetermined signal transmission characteristic is constant group delay with respect to the frequency components of the processed signals.

6. The apparatus of claim 4 wherein the predetermined signal transmission characteristic is insertion loss.

7. The apparatus of claim 4 wherein the predetermined signal transmission characteristic is return loss.

8. The apparatus of claim 1 wherein said high frequency signals include signals having frequencies between 8 GHz through 10 GHz.

9. Apparatus comprising:
   a printed circuit board having a transmission line thereon extending from a first circuit to a second circuit, in which said first and second circuits are mounted on the printed circuit board, said first circuit being operative for receiving high frequency digital signals from a source of signals and outputting a processed version of the received signals to the transmission line;
   said transmission line comprising,
      a first plurality of microstrips printed on the printed circuit board, in which the dimensions of each of the first plurality of microstrips are selected so that they simulate a first filter section at said high frequencies,
      a second plurality of microstrips printed on the printed circuit board, in which the dimensions of each of the second plurality of microstrips are selected so that they simulate a second filter section at said high frequencies, and in which the dimensions of each of the second plurality of microstrips are different from the dimensions of each of the first plurality of microstrips, and
      a lead connecting said first filter section to the second filter section, in which said lead simulates an inductor at said high frequencies,
   wherein said first and second filter sections and said lead connection have a transfer function optimized for minimal distortion of a digital pule.

10. The apparatus of claim 9 wherein said lead has a gull wing shape and the inductance of the gull wing lead is incorporated as an inductor in said first and second filter sections.

11. The apparatus of claim 9 wherein said first and second filter sections and said lead connection simulate a coaxial cable at said high frequencies.

12. The apparatus of claim 9 wherein said first and second filter sections and said lead connection has a transfer function optimized for a predetermined signal transmission parameter.

13. The apparatus of claim 12 wherein the predetermined signal transmission parameter is constant group delay with respect to the frequency components of the processed signals.

14. The apparatus of claim 12 wherein the predetermined signal transmission parameter is insertion loss.

15. The apparatus of claim 12 wherein the predetermined signal transmission parameter is return loss.

16. The apparatus of claim 9 wherein said high frequency signals include signals having frequencies between 8 GHz and 10 GHz.

17. Apparatus comprising:
   a printed circuit board having a transmission line thereon extending from a first circuit to a second circuit, in which said first and second circuits are mounted on the printed circuit board, said first circuit being operative for receiving high frequency digital signals from a source of signals and outputting a processed version of the received signals to the transmission line;
   said transmission line comprising,
      a first plurality of microstrips printed on the printed circuit board, in which the dimensions of each of the first plurality of microstrips are selected so that they simulate a first filter section at said high frequencies,
      a second plurality of microstrips printed on the printed circuit board, in which the dimensions of each of the second plurality of microstrips are selected so that they simulate a second filter section at said high frequencies, and in which the dimensions of the second plurality of microstrips and the dimensions of the first plurality of microstrips are asymmetrical, and
      a lead connecting said first filter section to the second filter section, in which said lead simulates an inductor at said high frequencies,
   wherein said first and second filter sections and said lead connection have a transfer function optimized for minimal distortion of a digital pulse.

* * * * *